(12) United States Patent
Zhang et al.

(10) Patent No.: US 10,311,961 B2
(45) Date of Patent: Jun. 4, 2019

(54) SHIFT REGISTER UNIT AND DRIVING UNIT THEREOF, GATE ELECTRODE DRIVING CIRCUIT AND DISPLAY APPARATUS

(71) Applicants: BOE Technology Group Co., Ltd., Beijing (CN); Chengdu BOE Optoelectronics Technology Co., Ltd., Sichuan Province (CN)

(72) Inventors: Kai Zhang, Beijing (CN); Han Zhang, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan Province (CN)

( * ) Notice: Subject to any disclaimer, the term of this patent is extended or adjusted under 35 U.S.C. 154(b) by 0 days.

(21) Appl. No.: 15/840,030

(22) Filed: Dec. 13, 2017

(65) Prior Publication Data

US 2018/0254091 A1 Sep. 6, 2018

(30) Foreign Application Priority Data

Mar. 3, 2017 (CN) .......................... 2017 1 0123700

(51) Int. Cl.
*G11C 19/18* (2006.01)
*G11C 19/28* (2006.01)
*G09G 3/36* (2006.01)

(52) U.S. Cl.
CPC ......... *G11C 19/184* (2013.01); *G09G 3/3677* (2013.01); *G11C 19/28* (2013.01); *G09G 2310/0286* (2013.01); *G09G 2310/0289* (2013.01)

(58) Field of Classification Search
None
See application file for complete search history.

(56) References Cited

U.S. PATENT DOCUMENTS

2009/0115792 A1* 5/2009 Otose .................. G09G 3/3677
345/559

FOREIGN PATENT DOCUMENTS

CN 103226981 A 7/2013

* cited by examiner

*Primary Examiner* — Kenneth B Lee, Jr.
(74) *Attorney, Agent, or Firm* — Fay Sharpe LLP (57) ABSTRACT

The present disclosure relates to a shift register unit and driving method thereof, a gate electrode driving circuit and a display apparatus, in the field of display technology. The shift register unit comprises an input circuit, an output circuit, a control circuit, a reset circuit, and a switch circuit. The switch circuit may control the second and third nodes to be disconnected when the electric potential of the input signal is the first electric potential (i.e., the effective electric potential). Thus, the following case can be avoided: when the second clock signal and the input signal have the first electric potential respectively, the second power source signal written into the third node by the second power source signal end is transmitted to the second node. As a result, the stability of the electric potential of the second node can be ensured. Further, as the reset circuit resets the first node and the output end under the control of the second node, after the electric potential of the second node stabilizes, the stability of the electric potential of the first node and the output end can be ensured.

20 Claims, 7 Drawing Sheets

| An input stage during which an input signal output by an input signal end IN has a first electric potential, a second clock signal output by a second clock signal end CKB has a first electric potential, the input circuit 10 charges a first node N1, the control circuit 30 inputs a first power source signal from a first power source signal end VGL to a third node N3 and inputs a second power source signal from a second power source signal end VGH to a second node N2, the switch circuit 50 controls the second node N2 and the third node N3 to be disconnected under control of the input signal and the second power source signal | 101 |

| An output stage during which a first clock signal output by a first clock signal end CK has the first electric potential, the first node N1 maintains the first electric potential, the output circuit 20 inputs the first clock signal to the output end OUT under control of the first node N1, and the switch circuit 50 controls the second node N2 and the third node N3 to be connected under control of the first clock signal and the first power source signal | 102 |

| A reset stage during which the second clock signal has the first electric potential, the control circuit 30 inputs the first power source signal to the third node N3, the switch circuit 50 controls the second node N2 and the third node N3 to maintain their connected state so that the electric potential of the third node N3 is written into the second node N2, and the reset circuit 40 inputs the second power source signal to the first node N1 and the output end OUT respectively under control of the second node N2 | 103 |

SHIFT REGISTER UNIT AND DRIVING UNIT THEREOF, GATE ELECTRODE DRIVING CIRCUIT AND DISPLAY APPARATUS

The present disclosure claims priority to Chinese patent application No. 201710123700.3, filed with the State Intellectual Property Office on Mar. 3, 2017 and titled "Shift register unit and driving method thereof, gate electrode driving circuit and display apparatus", which is incorporated herein by reference in its entirety.

TECHNICAL FIELD

The present disclosure is related to the field of display technology, and more particularly, to a shift register unit and driving method thereof, a gate electrode driving circuit and a display apparatus.

BACKGROUND

When displaying an image, a display apparatus needs a shift register (namely a gate electrode driving circuit) to scan pixel units. The shift register includes multiple cascading shift register units, each of which corresponds to a line of pixel units. The multiple cascading shift register units realize line-by-line scan-driving of each line of pixel units in the display apparatus to display the image.

The related art provides a shift register unit, which mainly includes an input circuit, an output circuit, a resetting control circuit and a reset circuit. The input circuit is configured to input an input signal from an input signal end to a first node so as to charge the first node. The output circuit is configured to input a driving signal to an output end under the control of the first node. The resetting control circuit is configured to control the electric potential of a second node under the control of a clock signal end. The reset circuit is configured to reset the first node and the output end under the control of the second node.

However, when both the clock signal and the input signal are in effective electric potentials, both the input circuit and the resetting control circuit may be in a working state as the resetting control circuit is controlled by the clock signal, which may affect the stability of the electric potentials of the first and second nodes.

SUMMARY

The present disclosure provides a shift register unit and driving method thereof, a gate electrode driving circuit and a display apparatus, which can solve the problem in the related art that the electric potentials of the nodes in the shift register unit have poor stability. The technical solutions are as below.

According to a first aspect, there is provided a shift register unit, which comprises: an input circuit, an output circuit, a control circuit, a reset circuit, and a switch circuit; the input circuit is connected to an input signal end and a first node respectively, and is configured to control an electric potential of the first node under the control of an input signal from the input signal end; the output circuit is connected to a first clock signal end, the first node, and an output end respectively, and is configured to input a first clock signal from the first clock signal end to the output end under the control of the first node; the control circuit is connected to a second clock signal end, a first power source signal end, a second power source signal end, the first node, a second node and a third node respectively, and is configured to input a second power source signal from the second power source signal end to the second node under the control of the first node and input a first power source signal from the first power source signal end to the third node under the control of a second clock signal from the second clock signal end; the reset circuit is connected to the second node, the first node, the output end and the second power source signal end respectively, and is configured to input the second power source signal to the first node and the output end respectively under the control of the second node, wherein the first power source signal has a first electric potential and the second power source signal has a second electric potential; the switch circuit is connected to the input signal end, the first clock signal end, the first power source signal end, the second power source signal end, the second node and the third node respectively, and is configured to control the second and third nodes to be disconnected through the second power source signal when an electric potential of the input signal is the first electric potential, and control the second and third nodes to be connected through the first power source signal when an electric potential the first clock signal is the first electric potential.

In some embodiments, the switch circuit comprises a control sub-circuit and a switch sub-circuit; the control sub-circuit is connected to the input signal end, the first clock signal end, the first power source signal end, the second power source signal end and a switch node respectively, and is configured to input the second power source signal to the switch node when the electric potential of the input signal is the first electric potential and input the first power source signal to the switch node when the electric potential of the first clock signal is the first electric potential; wherein an electric potential of the first power source signal is a first electric potential and an electric potential of the second power source signal is a second electric potential; the switch sub-circuit is connected to the switch node, the second node and the third node respectively, and is configured to control the second and third nodes to be disconnected when the electric potential of the switch node is the second electric potential and control the second and third nodes to be connected when the electric potential of the switch node is the first electric potential.

In some embodiments, the control sub-circuit comprises a first transistor, a second transistor and a first capacitor; a gate electrode of the first transistor is connected to the input signal end, a first electrode thereof is connected to the second power source signal end and a second electrode thereof is connected to the switch node; a gate electrode of the second transistor is connected to the first clock signal end, a first electrode thereof is connected to the first power source signal end and a second electrode thereof is connected to the switch node; one end of the first capacitor is connected to the second power source signal end and the other end thereof is connected to the switch node.

In some embodiments, the switch sub-circuit comprises a third transistor; a gate electrode of the third transistor is connected to the switch node, a first electrode thereof is connected to the third node and a second electrode thereof is connected to the second node.

In some embodiments, the input circuit comprises a fourth transistor; a gate electrode and a first electrode of the fourth transistor are respectively connected to the input signal end, and a second electrode thereof is connected to the first node.

In some embodiments, the output circuit comprises a fifth transistor and a second capacitor; a gate electrode of the fifth transistor is connected to the first node, a first electrode thereof is connected to the first clock signal end and a second electrode thereof is connected to the output end; one end of the second capacitor is connected to the first node and the other end thereof is connected to the output end.

In some embodiments, the control circuit comprises a sixth transistor, a seventh transistor and a third capacitor; a gate electrode of the sixth transistor is connected to the first node, a first electrode thereof is connected to the second power source signal end and a second electrode thereof is connected to the second node; a gate electrode of the seventh transistor is connected to the second clock signal end, a first electrode thereof is connected to the first power source signal end and a second electrode thereof is connected to the third node; one end of the third capacitor is connected to the second node and the other end thereof is connected to the second power source signal end.

In some embodiments, the reset circuit comprises an eighth transistor and a ninth transistor; a gate electrode of the eighth transistor is connected to the second node, a first electrode thereof is connected to the second power source signal end and a second electrode thereof is connected to the first node; a gate electrode of the ninth transistor is connected to the second node, a first electrode thereof is connected to the second power source signal end and a second electrode thereof is connected to the output end.

In some embodiments, the input circuit is connected to a reset signal end, a first control signal end and a second control signal end respectively, and comprises a tenth transistor and an eleventh transistor; a gate electrode of the tenth transistor is connected to the input signal end, a first electrode thereof is connected to the first control signal end and a second electrode thereof is connected to the first node; a gate electrode of the eleventh transistor is connected to the reset signal end, a first electrode thereof is connected to the second control signal end and a second electrode thereof is connected to the first node.

In some embodiments, the output circuit further comprises a twelfth transistor; a gate electrode of the twelfth transistor is connected to the first power source signal end, a first electrode thereof is connected to a pull-up node, and a second electrode thereof is connected to the gate electrode of the fifth transistor and the one end of the second capacitor respectively.

In some embodiments, all the transistors are P-type transistors, and the first electric potential is a low electric potential relative to the second electric potential.

According to a second aspect, there is provided a driving method of a shift register unit, and the shift register unit comprises an input circuit, an output circuit, a control circuit, a reset circuit and a switch circuit. The method comprises: an input stage during which an input signal output by an input signal end has a first electric potential, a second clock signal output by a second clock signal end has the first electric potential, the input circuit charges a first node, the control circuit inputs a first power source signal from a first power source signal end to a third node and inputs a second power source signal from a second power source signal end to a second node, the switch circuit controls the second and third nodes to be disconnected under the control of the input signal and the second power source signal, wherein the first power source signal has a first electric potential and the second power source signal has a second electric potential; an output stage during which a first clock signal output by a first clock signal end has the first electric potential, the first node maintains the first electric potential, the output circuit inputs the first clock signal to the output end under the control of the first node, and the switch circuit controls the second and third nodes to be connected under the control of the first clock signal and the first power source signal; a reset stage during which the second clock signal has the first electric potential, the control circuit inputs the first power source signal to the third node, the switch circuit controls the second and third nodes to maintain their connected states so that the electric potential of the third node is written into the second node, and the reset circuit inputs the second power source signal to the first node and the output end under the control of the second node.

In some embodiments, the switch circuit comprises a control sub-circuit and a switch sub-circuit; the control sub-circuit comprises a first transistor, a second transistor and a first capacitor; the switch sub-circuit comprises a third transistor; a first electrode of the third transistor is connected to the third node and a second electrode thereof is connected to the second node; during the input stage, the input signal has the first electric potential, the first transistor in the control sub-circuit is turned on, the second power source signal end outputs the second power source signal to a switch node, and the third transistor is turned off; during the output stage, the first clock signal has the first electric potential, the second transistor in the control sub-circuit is turned on, the first power source signal end outputs the first power source signal to the switch node, and the third transistor is turned on; during the reset stage, the first capacitor in the control sub-circuit enables the switch node to maintain the first electric potential, and the third transistor maintains its on state.

In some embodiments, all the transistors are P-type transistors, and the first electric potential is a low electric potential relative to the second electric potential.

In some embodiments, the input circuit comprises a fourth transistor; the output circuit comprises a fifth transistor and a second capacitor; during the input stage, the input signal has the first electric potential, the fourth transistor is turned on, the input signal end charges the first node, the fifth transistor is turned on, and the first clock signal end outputs the first clock signal having the second electric potential to the output end; during the output stage, the first clock signal has the first electric potential, the second capacitor enables the first node to maintain the first electric potential, the fifth transistor maintains its on state, and the first clock signal end outputs the first clock signal having the first electric potential to the output end.

In some embodiments, the control circuit comprises a sixth transistor, a seventh transistor and a third capacitor; during the input stage, the first node has the first electric potential, the second clock signal has the first electric potential, the sixth transistor is turned on under the control of the first node, the seventh transistor is turned on under the control of the second clock signal, the second power source signal end outputs the second power source signal to the second node via the sixth transistor, and the first power source signal end outputs the first power source signal to the third node via the seventh transistor; during the reset stage, the first node has the second electric potential, the sixth transistor is turned off, the second clock signal has the first electric potential, the seventh transistor is turned on, and the first power source signal end outputs the first power source signal to the third node.

In some embodiments, the reset circuit comprises an eighth transistor and a ninth transistor; during the reset stage, the second node has the first electric potential, the eighth and ninth transistors are turned on, and the second power source signal end outputs the second power source signal to the first node via the eighth transistor and to the output end via the ninth transistor.

According to a third aspect, there is provided a gate electrode driving circuit. The gate electrode driving circuit comprises: at least two cascading shift register units, each of which comprises an input circuit, an output circuit, a control circuit, a reset circuit, and a switch circuit; the input circuit is connected to an input signal end and a first node respectively, and is configured to control the electric potential of the first node under the control of an input signal from the input signal end; the output circuit is connected to a first clock signal end, the first node, and an output end respectively, and is configured to input a first clock signal from the first clock signal end to the output end under the control of the first node; the control circuit is connected to a second clock signal end, a first power source signal end, a second power source signal end, the first node, a second node and a third node respectively, and is configured to input a second power source signal from the second power source signal end to the second node under the control of the first node and input a first power source signal from the first power source signal end to the third node under the control of a second clock signal from the second clock signal end; the reset circuit is connected to the second node, the first node, the output end and the second power source signal end respectively, and is configured to input the second power source signal to the first node and the output end respectively under the control of the second node; wherein the first power source signal has a first electric potential and the second power source signal has a second electric potential; the switch circuit is connected to the input signal end, the first clock signal end, the first power source signal end, the second power source signal end, the second node and the third node respectively, and is configured to control the second and third nodes to be disconnected through the second power source signal when the input signal has the first electric potential, and control the second and third nodes to be connected state through the first power source signal when the first clock signal has the first electric potential.

According to a fourth aspect, there is provided a display apparatus comprising the gate electrode driving circuit according to the third aspect.

According to a fifth aspect, there is provided a non-transitory readable storage medium storing instructions that, when executed on a processing component, cause the processing component to perform the driving method of the second aspect.

The present disclosure provides a shift register unit and the driving method thereof, a gate electrode driving circuit and a display apparatus. The switch circuit in the shift register unit may control the second and third nodes to be disconnected when the electric potential of the input signal is the first potential (i.e., the effective potential). Thus, the following case can be avoided: the second power source signal written into the third node by the second power source signal end is transmitted to the second node when the second clock signal and the input signal have the first electric potential at the same time. As a result, the stability of the electric potential of the second node can be ensured. Further, as the reset circuit resets the first node and the output end under the control of the second node, after the electric potential of the second node stabilizes, the stability of the electric potential of the first node and the output end can be ensured.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION OF THE EMBODIMENTS

To make the objectives, technical solutions and advantages of the present disclosure clearer, the embodiments of the present disclosure will be described in detail with reference to the accompanying drawings.

The transistor used in all the embodiments of the present disclosure may be a thin film transistor or a field effect transistor or other components having the same properties. The transistor used in the embodiments of the present disclosure is mainly a switch transistor, in accordance with the role of the transistor in a circuit. As the source electrode and the drain electrode of the switch transistor used herein are symmetrical, they may be interchangeable. In the embodiments of the present disclosure, the source electrode is called the first electrode, and the drain electrode is called the second electrode. It is specified that the middle end of the transistor is the gate electrode, the signal input end is the source electrode, and the signal output end is the drain electrode, based on the configuration in the drawings. In addition, the transistor used in the embodiments of the present disclosure may include either a P-type switch transistor or an N-type switch transistor. The P-type switch transistor is turned on when the gate electrode is in a low electric potential, and is turned off when the gate electrode is in a high electric potential. The N-type switch transistor is turned on when the gate electrode is in a high electric potential, and is turned off when the gate electrode is in a low electric potential. Further, each of the signals in the embodiments of the present disclosure corresponds to a first electric potential and a second electric potential. The first and second electric potentials only indicate that the electric potentials of the signal have two states, and do not indicate that the first or second electric potential in the present disclosure has a specific value.

Figure 1:
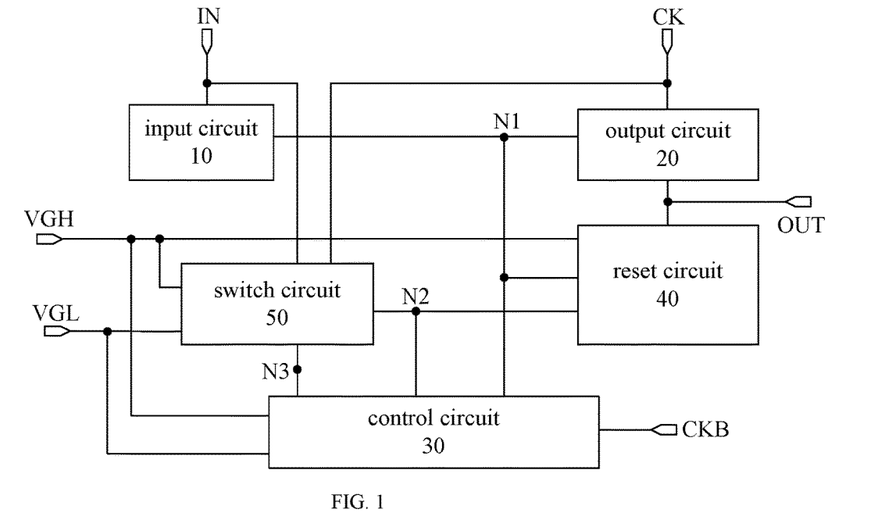
FIG. 1 is a structural schematic view of a shift register unit provided by an embodiment of the present disclosure.

FIG. 1 is a schematic structural view of a shift register unit provided by an embodiment of the present disclosure. As shown in FIG. 1, the shift register unit may include an input circuit 10, an output circuit 20, a control circuit 30, a reset circuit 40, and a switch circuit 50.

The input circuit 10 is connected to an input signal end IN and a first node N1 respectively, and is configured to control the electric potential of the first node N1 under the control of an input signal from the input signal end IN.

For example, when the input signal has a first electric potential, the input circuit 10 may control the electric potential of the first node N1 to be the first electric potential.

The output circuit 20 is connected to a first clock signal end CK, the first node N1 and an output end OUT respectively, and is configured to input a first clock signal to the output end OUT under the control of the first node N1.

For example, when the first node N1 has the first electric potential, the output circuit 20 may input the first clock signal to the output end OUT.

The control circuit 30 is connected to a second clock signal end CKB, a first power source signal end VGL, a second power source signal end VGH, the first node N1, a second node N2 and a third node N3 respectively, and is configured to input a second power source signal from the second power source signal end VGH to the second node N2 under the control of the first node N1 and input a first power source signal from the first power source signal end VGL to the third node N3 under the control of a second clock signal from the second clock signal end CKB.

For example, when the first node N1 has the first electric potential, the control circuit 30 may input the second power source signal from the second power source signal end VGH to the second node N2; and when the second clock signal has the first electric potential, the control circuit 30 may input the first power source signal from the first power source signal end VGL to the third node N3.

The reset circuit 40 is connected to the second node N2, the first node N1, the output end OUT and the second power source signal end VGH respectively, and is configured to input the second power source signal to the first node N1 and the output end OUT respectively under the control of the second node N2.

For example, when the second node N2 has the first electric potential, the reset circuit 40 may input the second power source signal to the first node N1 and the output end OUT respectively.

The switch circuit 50 is connected to the input signal end IN, the first clock signal end CK, the first power source signal end VGL, the second power source signal end VGH, the second node N2 and the third node N3 respectively, and is configured to control the second node N2 and the third node N3 to be disconnected through the second power source signal when the input signal has the first electric potential, and is configured to control the second node N2 and third node N3 to be connected through the first power source signal when the first clock signal has the first electric potential.

The first power source signal has the first electric potential, the second power source signal has the second electric potential, and the first electric potential is an effective electric potential.

To sum up, there is provided a shift register unit by the embodiment of the present disclosure. The switch circuit of the shift register unit can control the second and third nodes to be disconnected when the input signal has the first electric potential (namely the effective electric potential). Thus, the following case can be avoided: the second power source signal written into the third node by the second power source signal end is transmitted to the second node when both the second clock signal and the input signal have the first electric potential at the same time. As a result, the stability of the electric potential of the second node can be ensured. Further, as the reset circuit resets the first node and the output end under the control of the second node, after the electric potential of the second node stabilizes, the stability of the electric potential of the first node and the output end can be ensured.

Figure 2:
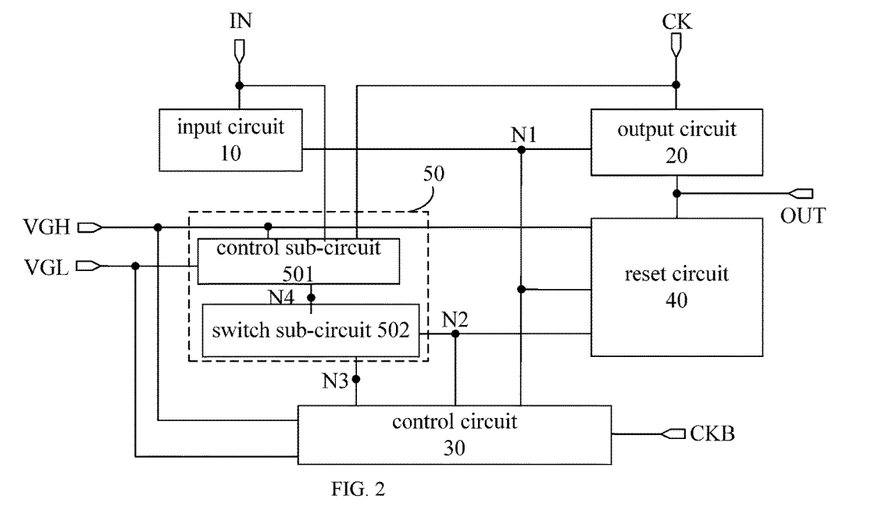
FIG. 2 is a structural schematic view of another shift register unit provided by an embodiment of the present disclosure.

FIG. 2 is a schematic structural view of another shift register unit provided by an embodiment of the present disclosure. As shown in FIG. 2, the switch circuit 50 includes a control sub-circuit 501 and a switch sub-circuit 502.

The control sub-circuit 501 is connected to the input signal end IN, the first clock signal end CK, the first power source signal end VGL, the second power source signal end VGH and a switch node N4 respectively, and is configured to input the second power source signal to the switch node N4 when the input signal has the first electric potential and input the first power source signal to the switch node N4 when the first clock signal has the first electric potential.

The switch sub-circuit 502 is connected to the switch node N4, the second node N2 and the third node N3, and is configured to control the second node N2 and the third node N3 to be disconnected when the electric potential of the switch node N4 is the second electric potential and control the second node N2 and the third node N3 to be connected when the electric potential of the switch node N4 is the first electric potential.

It can be known from the above analysis that when the input signal has the first electric potential, the switch node N4 has the second electric potential, and the second node N2 and the third node N3 are turned off; and when the first clock signal has the first electric potential, the switch node N4 has the first electric potential, and the second node N2 and the third node N3 are turned on.

Figure 3:
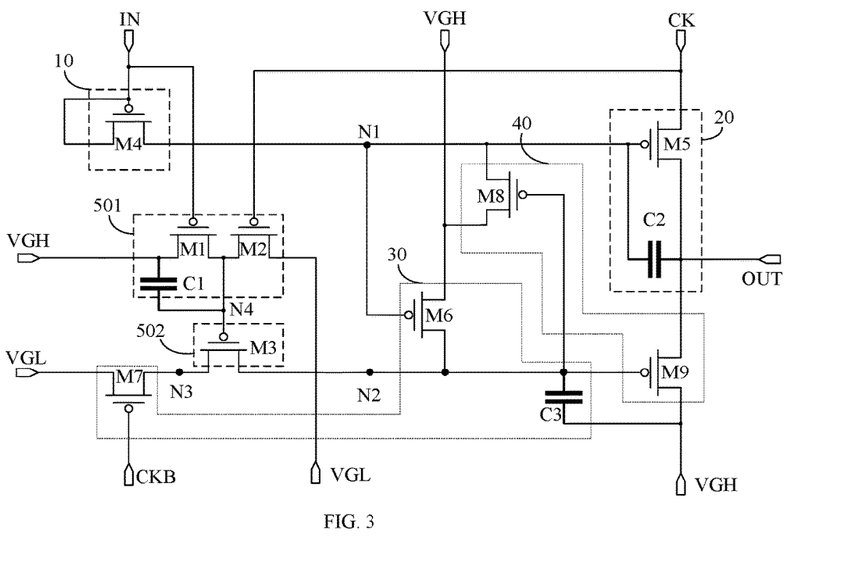
FIG. 3 is a structural schematic view of a yet another shift register unit provided by an embodiment of the present disclosure.

FIG. 3 is a schematic structural view of yet another shift register unit provided by an embodiment of the present disclosure. As shown in FIG. 3, the control sub-circuit 501 may include a first transistor M1, a second transistor M2 and a first capacitor C1. The switch sub-circuit 502 may include a third transistor M3.

A gate electrode of the first transistor M1 is connected to the input signal end IN, a first electrode thereof is connected to the second power source signal end VGH and a second electrode thereof is connected to the switch node N4.

A gate electrode of the second transistor M2 is connected to the first clock signal end CK, a first electrode thereof is connected to the first power source signal end VGL and a second electrode thereof is connected to the switch node N4.

One end of the first capacitor C1 is connected to the second power source signal end VGH and the other end thereof is connected to the switch node N4.

A gate electrode of the third transistor M3 is connected to the switch node N4, a first electrode thereof is connected to the third node N3 and a second electrode thereof is connected to the second node N2.

When the input signal has the first electric potential, the first transistor M1 is turned on, the second power source signal end VGH outputs the second power source signal to the switch node N4, the third transistor M3 is turned off, and the connection between the second node N2 and the third node N3 is cut off.

When the first clock signal has the first electric potential, the second transistor M2 is turned on, the first power source signal end VGL outputs the first power source signal to the switch node N4, the third transistor M3 is turned on, and the connection between the second and third nodes is established.

When both the first transistor M1 and the second transistor M2 are turned off, the first capacitor C1 can enable the switch node N4 to maintain the electric potential of the previous stage.

Further, referring to FIG. 3, the input circuit 10 may include a fourth transistor M4.

A gate electrode and a first electrode of the fourth transistor M4 are respectively connected to the input signal end IN, and a second electrode thereof is connected to the first node N1. When the input signal has the first electric potential, the fourth transistor M4 is turned on, and the input signal end IN may charge the first node N1 via the fourth transistor M4.

In some embodiments, as shown in FIG. 3, the output circuit 20 may include a fifth transistor M5 and a second capacitor C2.

A gate electrode of the fifth transistor M5 is connected to the first node N1, a first electrode thereof is connected to the first clock signal end CK and a second electrode thereof is connected to the output end OUT. One end of the second capacitor C2 is connected to the first node N1 and the other end thereof is connected to the output end OUT.

When the first node N1 has the first electric potential, the fifth transistor M5 is turned on, and the first clock signal end CK can output the first clock signal to the output end OUT via the fifth transistor M5. As the two ends of the second capacitor C2 are respectively connected to the output end OUT and the first node N1, when the electric potential of the output end OUT changes, the second capacitor C2 can control the electric potential of the first node N1 to change accordingly.

In some embodiments, as shown in FIG. 3, the control circuit 30 may include a sixth transistor M6, a seventh transistor M7 and a third capacitor C3.

A gate electrode of the sixth transistor M6 is connected to the first node N1, a first electrode thereof is connected to the second power source signal end VGH and a second electrode thereof is connected to the second node N2.

A gate electrode of the seventh transistor M7 is connected to the second clock signal end CKB, a first electrode thereof is connected to the first power source signal end VGL and a second electrode thereof is connected to the third node N3.

One end of the third capacitor C3 is connected to the second node N2 and the other end thereof is connected to the second power source signal end VGH.

When the first node N1 has the first electric potential, the sixth transistor M6 is turned on, and the second power source signal end VGH outputs the second power source signal to the second node N2, so that the transistors in the reset circuit 40 can be controlled to turn off. Thus, the following case can be avoided: after the transistors in the reset circuit 40 are turned on, the electric potential of the output end OUT is affected. When the second clock signal has the first electric potential, the seventh transistor M7 is turned on, and the first power source signal end VGL outputs the first power source signal to the third node N3. If the third transistor M3 is turned on at this moment, the first power source signal end VGL may write the first power source signal into the second node N2 via the seventh transistor M7 and the third transistor M3.

Referring to FIG. 3, the reset circuit 40 may include an eighth transistor M8 and a ninth transistor M9.

A gate electrode of the eighth transistor M8 is connected to the second node N2, a first electrode thereof is connected to the second power source signal end VGH and a second electrode thereof is connected to the first node N1.

A gate electrode of the ninth transistor M9 is connected to the second node N2, a first electrode thereof is connected to the second power source signal end VGH and a second electrode thereof is connected to the output end OUT.

When the second node N2 has the first electric potential, the eighth transistor M8 and the ninth transistor M9 are turned on, and the second power source signal end VGH outputs the second power source signal to the first node N1 and the output end OUT respectively. As the second power source signal has the second electric potential, the first node N1 and the output end OUT can be reset.

Figure 4:
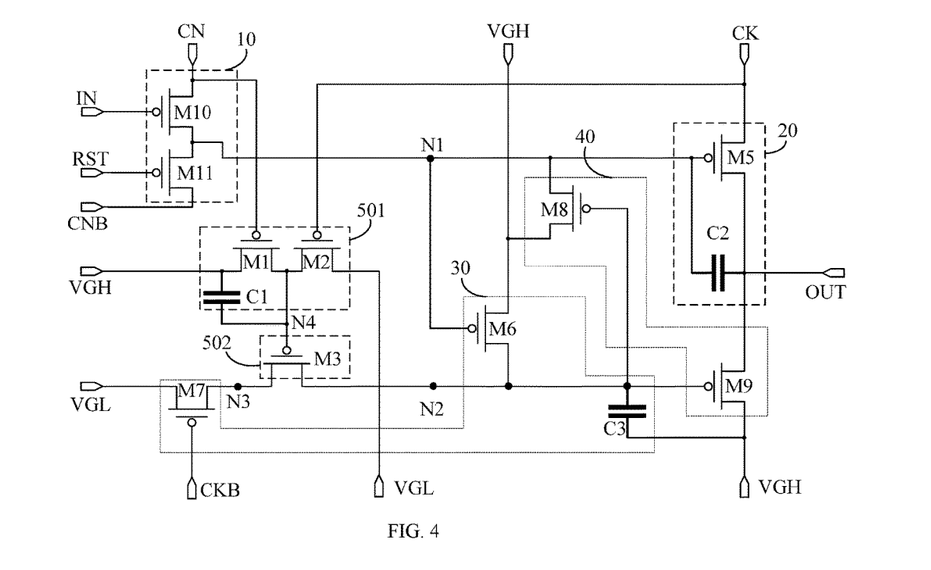
FIG. 4 is a structural schematic view of a still yet another shift register unit provided by an embodiment of the present disclosure.

FIG. 4 is schematic structural view of yet another shift register unit provided by an embodiment of the present disclosure. As shown in FIG. 4, the input circuit 10 may also be connected to a resetting signal end RST, a first control signal end CN and a second control signal end CNB, and may comprise a tenth transistor M10 and an eleventh transistor M11.

A gate electrode of the tenth transistor M10 is connected to the input signal end IN, a first electrode thereof is connected to the first control signal end CN and a second electrode thereof is connected to the first node N1.

A gate electrode of the eleventh transistor M11 is connected to the resetting signal end RST, a first electrode thereof is connected to the second control signal end CNB and a second electrode thereof is connected to the first node N1.

The resetting signal end RST in the shift register unit of each stage may be connected to an output end of a shift register unit of a next stage, and the input signal end IN in the shift register unit of each stage may be connected to an output end of a shift register unit of a previous stage. The first control signal end CN and the second control signal end CNB in the shift register unit of each stage are positive and negative control signal ends respectively. If the first control signal end CN outputs a first control signal of the first electric potential, and the second control signal end CNB outputs a second control signal of the second electric potential, all shift register units in the gate electrode driving circuit can be turned on sequentially from the shift register unit of the first stage, thereby realizing the forward scanning of a display apparatus. If the first control signal end CN outputs a first control signal of the second electric potential, and the second control signal end CNB outputs a second control signal of the first electric potential, all shift register units in the gate electrode driving circuit can be turned on sequentially from the shift register unit of the last stage, thereby realizing the reverse scanning of the display apparatus.

Figure 5:
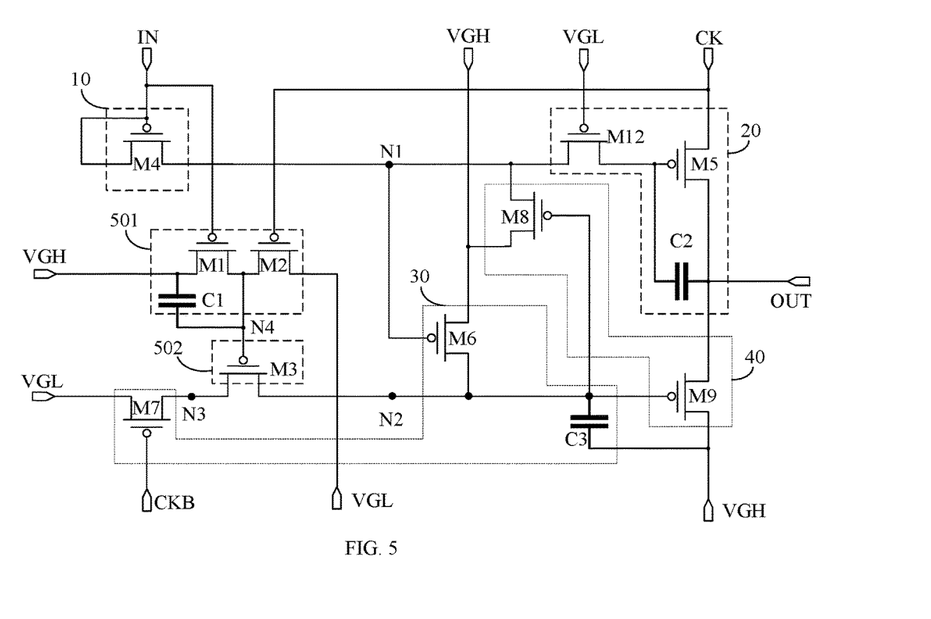
FIG. 5 is a structural schematic view of a still yet another shift register unit provided by an embodiment of the present disclosure.

FIG. 5 is schematic structural view of yet another shift register unit provided by an embodiment of the present disclosure. As shown in FIG. 5, the output circuit 20 may further include a twelfth transistor M12.

A gate electrode of the twelfth transistor M12 is connected to the first power source signal end VGL, a first electrode thereof is connected to a pull-up node, and a second electrode thereof is connected to the gate electrode of the fifth transistor M5 and the one end of the second capacitor C2 respectively.

During the input and output stages of the shift register unit, the first node N1 has the first electric potential, the fifth transistor M5 is turned on, and the first clock signal end CK outputs the first clock signal to the output end OUT. If the twelfth transistor M12 is omitted, the two ends of the second capacitor C2 are respectively connected to the first node N1 and the output end OUT. As the first clock signal has the second electric potential during the input stage and has the first electric potential during the output stage, the electric potential of the output end OUT will hop from the second electric potential to the first electric potential (namely from a high electric potential to a low electric potential) when the shift register unit enters the output stage from the input stage. At this time, the electric potential of the first node N1 will drop due to the bootstrap function of the capacitor C2, that is, the electric potential of the first node N1 is further decreased. As the first node N1 is further connected to the second electrode of the fourth transistor M4, the gate electrode of the sixth transistor M6 and the second electrode of the eighth transistor M8, and the gate electrode and the first electrode of the fourth transistor M4, the first electrode of the sixth transistor M6 and the first electrode of the eighth transistor M8 have the first electric potential respectively, when the electric potential of the first node N1 is further decreased, the fourth transistor M4, the sixth transistor M6 and the eighth transistor M8 will work under a high bias voltage, and the service life and the operation stability of the transistors will be adversely affected.

In the shift register unit shown in FIG. 5, the output circuit 20 includes the twelfth transistor M12, and the two ends of the second capacitor C2 are respectively the output end OUT and the second electrode of the twelfth transistor M12. As shown in FIG. 5, the gate electrode of the twelfth transistor M12 has the electric potential of the first power source signal end VGL (namely the first electric potential). During the output stage, when the first node N1 has the first electric potential, the gate source voltage VGS of the twelfth transistor M12 is 0, and the twelfth transistor M12 is in an off state. Thus, due to the bootstrap function of the capacitor C2, when the electric potential of the second electrode of the twelfth transistor M12 is further decreased, the electric potential of the first node N1 is not affected and can be maintained at the first electric potential. As a result, the fourth transistor M4, the sixth transistor M6 and the eighth transistor M8 will work under a normal bias voltage, and the operation stability of the shift register unit is further ensured.

To sum up, there is provided a shift register unit by the embodiment of the present disclosure. The switch circuit of the shift register unit can control the second and third nodes to be disconnected when the input signal has the first electric potential (namely the effective electric potential). Thus, the following case can be avoided: the second power source signal written into the third node by the second power source signal end is transmitted to the second node when both the second clock signal and the input signal have the first electric potential at the same time. As a result, the stability of the electric potential of the second node can be ensured. Further, as the reset circuit resets the first node and the output end under the control of the second node, after the electric potential of the second node stabilizes, the stability of the electric potential of the first node and the output end can be ensured.

Figure 6:
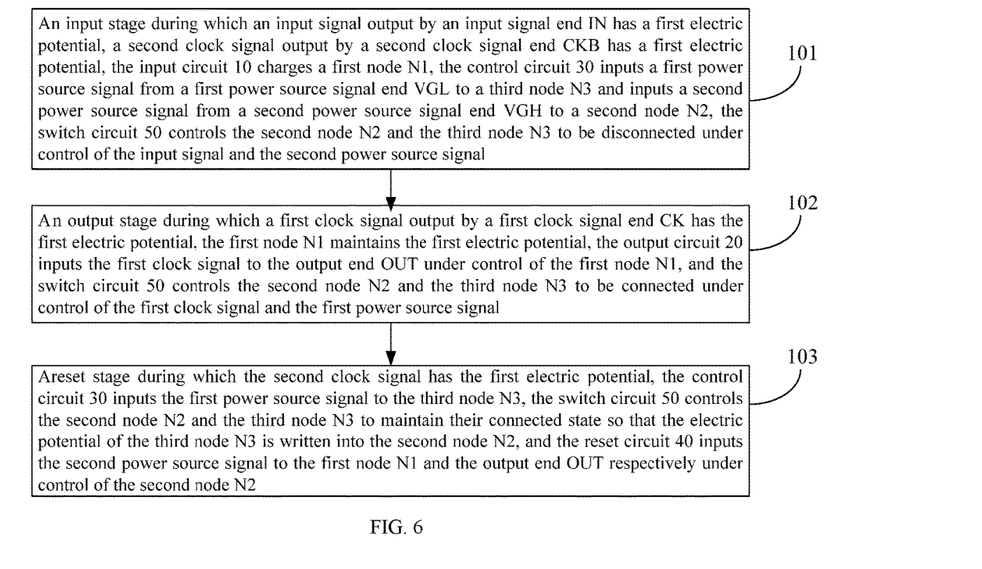
FIG. 6 is a flow chart of a method for driving a shift register unit provided by an embodiment of the present disclosure.

FIG. 6 is a flow chart of a driving method of a shift register unit provided by an embodiment of the present disclosure. The method can be applied to drive any of the shift register units shown in FIGS. 1-5. As shown in FIG. 6, the method may include the following steps:

At step 101, an input stage during which an input signal output by an input signal end IN has a first electric potential, a second clock signal output by a second clock signal end CKB has a first electric potential, the input circuit 10 charges a first node N1, the control circuit 30 inputs a first power source signal from a first power source signal end VGL to a third node N3 and inputs a second power source signal from a second power source signal end VGH to a second node N2, the switch circuit 50 controls the second node N2 and the third node N3 to be disconnected under control of the input signal and the second power source signal.

Wherein the first power source signal has the first electric potential and the second power source signal has the second electric potential.

At step 102, an output stage during which a first clock signal output by a first clock signal end CK has the first electric potential, the first node N1 maintains the first electric potential, the output circuit 20 inputs the first clock signal to the output end OUT under control of the first node N1, and the switch circuit 50 controls the second node N2 and the third node N3 to be connected under control of the first clock signal and the first power source signal.

At step 103, a reset stage during which the second clock signal has the first electric potential, the control circuit 30 inputs the first power source signal to the third node N3, the switch circuit 50 controls the second node N2 and the third node N3 to maintain their connected state so that the electric potential of the third node N3 is written into the second node N2, and the reset circuit 40 inputs the second power source signal to the first node N1 and to the output end OUT respectively under control of the second node N2.

To sum up, there is provided a driving method of a shift register unit by the embodiment of the present disclosure. During the input stage, both the input signal and the second clock signal have the first electric potential at the same time, the control circuit inputs the first power source signal to the third node and inputs the second power source signal to the second node, and the switch circuit can ensure the disconnection between the second and third nodes. Therefore, the following case is avoided: the first power source signal of the third node is written into the second node. The stability of the electric potential of the second node is ensured. Further, as the reset circuit resets the first node and the output end under the control of the second node, after the electric potential of the second node stabilizes, the stability of the electric potential of the first node and the output end can be ensured.

In some embodiments, referring to FIG. 2, the switch circuit 50 includes a control sub-circuit 501 and a switch sub-circuit 502. As shown in FIG. 3, the control sub-circuit 501 may include a first transistor M1, a second transistor M2 and a first capacitor C1. The switch sub-circuit 502 may include a third transistor M3. A first electrode of the third transistor M3 is connected to the third node N3 and a second electrode thereof is connected to the second node N2.

During the input stage, the input signal has the first electric potential, the first transistor M1 of the control sub-circuit 501 is turned on, the second power source signal end VGH outputs the second power source signal to the switch node N4, the third transistor M3 is turned off, and the connection between the second node N2 and the third node N3 is cut off.

During the output stage, the first clock signal has the first electric potential, the second transistor M2 of the control sub-circuit 501 is turned on, the first power source signal end VGL outputs the first power source signal to the switch node N4, the third transistor M3 is turned on, and the connection between the second node N2 and the third node N3 is established.

During the reset stage, the first capacitor C1 of the control sub-circuit 501 enables the switch node N4 to maintain the first electric potential, the third transistor M3 maintains being in the on state, and the second node N2 and the third node N3 maintain their connected state.

In some embodiments, as shown in FIG. 3, the input circuit 10 may include a fourth transistor M4, and the output circuit 20 may include a fifth transistor M5 and a second capacitor C2.

During the input stage, the input signal has the first electric potential, the fourth transistor M4 is turned on, the input signal end charges the first node N1, the fifth transistor M5 is turned on, and the first clock signal end CK outputs the first clock signal having the second electric potential to the output end OUT.

During the output stage, the first clock signal has the first electric potential, the second capacitor C2 enables the first node N1 to maintain the first electric potential, the fifth transistor M5 maintains being in the on state, and the first clock signal end CK outputs the first clock signal having the first electric potential to the output end OUT.

In some embodiments, as shown in FIG. 3, the control circuit 30 may include a sixth transistor M6, a seventh transistor M7 and a third capacitor C3.

During the input stage, the first node N1 has the first electric potential, the second clock signal has the first electric potential, the sixth transistor M6 is turned on under the control of the first node N1, the seventh transistor M7 is turned on under the control of the second clock signal, the second power source signal end VGH outputs the second power source signal to the second node N2 via the sixth transistor M6, and the first power source signal end VGL outputs the first power source signal to the third node N3 via the seventh transistor M7.

During the reset stage, the first node N1 has the second electric potential, the sixth transistor M6 is turned off, the second clock signal has the first electric potential, the seventh transistor M7 is turned on, and the first power source signal end VGL outputs the first power source signal to the third node N3. As the third transistor M3 is also in the on state during the reset stage, the first power source signal end VGL may write the first power source signal into the second node N2 via the seventh transistor M7 and the third transistor M3.

In some embodiments, as shown in FIG. 3, the reset circuit 40 may include an eighth transistor M8 and a ninth transistor M9.

During the reset stage, the second node N2 has the first electric potential, the eighth transistor M8 and the ninth transistor M9 are turned on under the control of the second node N2, the second power source signal end VGH outputs the second power source signal to the first node N1 via the eighth transistor M8 and outputs the second power source signal to the output end OUT via the ninth transistor M9 so as to reset the first node N1 and the output end OUT.

Figure 7:
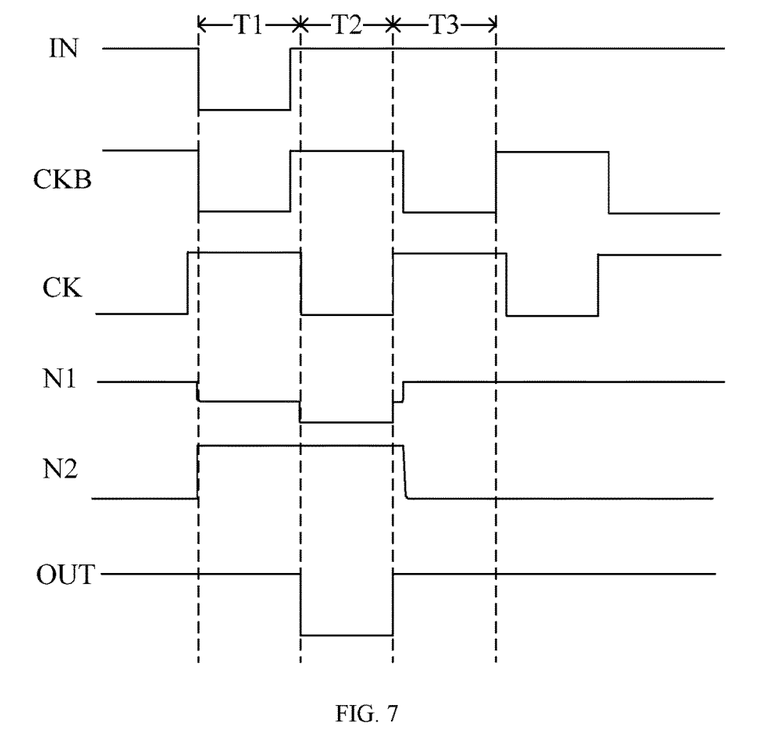
FIG. 7 is a driving sequence diagram of a shift register unit provided by an embodiment of the present disclosure.

FIG. 7 is a driving sequence diagram of a shift register unit provided by an embodiment of the present disclosure. The driving method of a shift register unit provided by an embodiment of the present disclosure is explained in detail by taking the shift register unit shown in FIG. 3 as an example, by exemplifying the transistors as P-type transistors and by exemplifying the first electric potential as a low electric potential relative to the second electric potential.

Referring to FIG. 7, during the input stage T1, the input signal output by the input signal end IN has the first electric potential, the second clock signal output by the second clock signal end CKB has the first electric potential, and the first clock signal output by the first clock signal end CK has the second has the second electric potential. The fourth transistor M4 is turned on under the control of the input signal, the seventh transistor M7 is turned on under the control of the second clock signal, and the input signal end IN inputs the input signal to the first node N1 via the fourth transistor M4 to pull down the electric potential of the first node N1. The first power source signal end VGL outputs the first power source signal having the first electric potential to the third node N3 via the seventh transistor M7 to pull up the electric potential of the third node N3. Further, as the first node N1 has the first electric potential, and the sixth transistor M6 is turned on, the second power source signal end VGH can output the second power source signal having the second electric potential to the second node N2 via the sixth transistor M6. At the same time, the first transistor M1 of the switch circuit 50 is turned on under the control of the input signal. The second power source signal end VGH controls the switch node N4 to have the second electric potential, so that the third transistor M3 is turned off. At this time, the second node N2 and the third node N3 are disconnected, and the electric potential of the second node N2 will not be affected by the third node N3 and can be maintained at the second electric potential.

During the input stage T1, the first node N1 has the first electric potential, the second node N2 has the second electric potential, the fifth transistor M5 is turned on under the control of the first node N1, the ninth transistor M9 is turned off under the control of the second node N2, and the first clock signal end CK can output the first clock signal having the second electric potential to the output end OUT via the fifth transistor M5.

In the related art, during the input stage T1, as the switch circuit is not provided, the electric potential of the second node N2 will be pulled down by the third node N3, so that the eighth transistor M8 is turned on, whereby the first node N1 and the second node N2 will form a return circuit via the sixth transistor M6 and the eighth transistor M8. As a result, the electric potentials of the two nodes affect each other, and both of the two nodes have instable intermediate electric potentials, which affects the normal operation of the shift register unit. While in the shift register unit provided by the embodiments of the present disclosure, the switch circuit 30 can disconnect the second node N2 and the third node N3 when the input signal and the second clock signal have the first electric potential respectively during the input stage T1, so that the second node N2 can maintain its second potential. As the eighth transistor M8 can maintain being in the off state under the control of the second node N2, the first node N1 and the second node N2 will not form a closed circuit, thereby ensuring the stability of the electric potential of the first node N1.

Further, during the output stage T2, the input signal has the second electric potential, the second clock signal has the second electric potential, the first clock signal output by the first clock signal end CK has the first electric potential, the first transistor M1 and the fourth transistor M4 are turned off under the control of the input signal, and the seventh transistor M7 is turned off under the control of the second clock signal. Due to the presence of the second capacitor C2 and the third capacitor C3, the first node N1 can maintain the first electric potential, and the second node N2 can maintain the second electric potential. In other words, the second capacitor C2 can maintain the electric potential of the first node N1, and the third capacitor C3 can maintain the electric potential of the second node N2. In addition, as the first clock signal has the first electric potential, under the boot strap function of the capacitor C1, the electric potential of the first node N1 will be further pulled down, so that the fifth transistor M5 can be sufficiently turned on. The first clock signal end CK will output the first clock signal having the first electric potential to the output end OUT.

At the same time, the second transistor M2 of the switch circuit 50 can be turned on under the control of the first clock signal, and the first power source signal end VGL outputs the first power source signal having the first electric potential to the switch node N4 via the second transistor M2 and stores the first electric potential in the first capacitor C1. At this time, the third transistor M3 is turned on under the control of the switch node N4, and the second node N2 and the third node N3 are connected.

During the reset stage T3, the input signal has the second electric potential, the first clock signal has the second electric potential, the second clock signal has the first electric potential, the first transistor M1, the fourth transistor M4 and the seventh transistor M7 are turned off under the control of the input signal, the seventh transistor M7 is turned on under the control of the second clock signal, and the first power source signal end VGL outputs the first power source signal having the first electric potential to the third node N3 via the seventh transistor M7. Due to the presence of the first capacitor C1, the switch node N4 maintains the first electric potential, the third transistor M3 is controlled by the switch node N4 to maintain being in the on state, and the second node N2 and the third node N3 are connected. As a result, the first electric potential of the third node N3 is written into the second node N2, the eighth transistor M8 and the ninth transistor M9 are turned on under the control of the second node N2, the second power source signal end VGH outputs the second power source signal to the first node N1 via the eighth transistor M8 and outputs the second power source signal to the output end OUT via the ninth transistor M9 so as to reset the first node N1 and the output end OUT. At this time, the fifth transistor M5 is turned off, and the output end OUT outputs the second power source signal having the second electric potential.

After that, the shift register unit can continue maintaining the reset stage T3 until the input signal output by the input signal end IN hops to the first electric potential again.

As it can be seen from FIG. 7, during the driving process of the shift register unit, the electric potential of the second node N2 is maintained at the second electric potential during both the input stage T1 and output stage T2. The electric potential of the second node N2 hops less, and burr deterioration will not occur, which effectively ensures the operation stability of the shift register unit.

Figure 8:
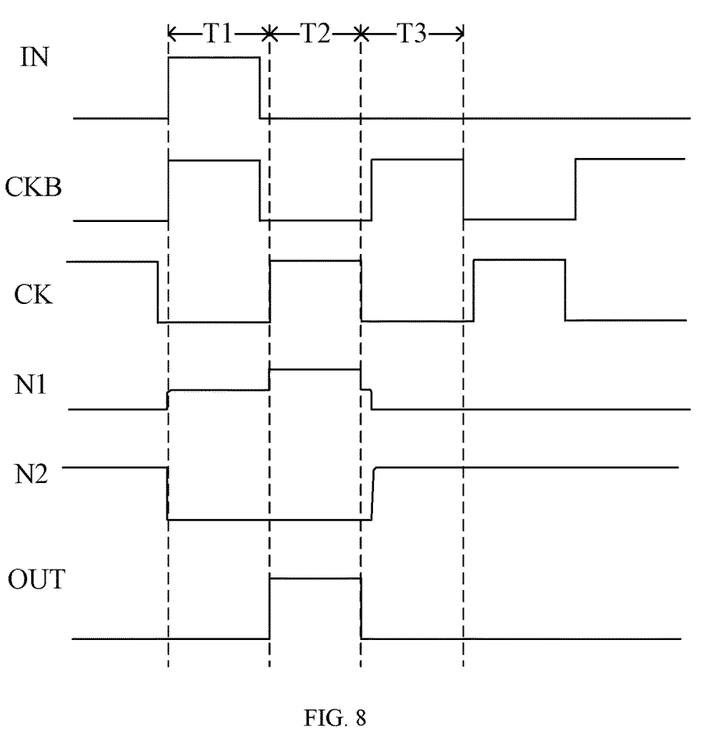
FIG. 8 is a driving sequence diagram of another shift register unit provided by an embodiment of the present disclosure.

It should be noted that the above embodiments are exemplified with the first to twelfth transistors being P-type ones, and the first electric potential being a low electric potential relative to the second electric potential. Of course, the first to twelfth transistors may be N-type ones; in this case, the first electric potential may be a high electric potential relative to the second electric potential, and the electric potential changes at each signal end may be opposite to the electric potential changes shown in FIG. 7 (that is, the phase difference between the two is 180 degrees). As it can be seen from FIG. 8, the sequence of the signals output from each signal end is complementary to the sequence shown in FIG. 7 when the first to twelfth transistors are N-type ones.

To sum up, the embodiments of the present disclosure provide a driving method of a shift register unit. During the input stage, both the input signal and the second clock signal have the first electric potential, the control circuit inputs the first power source signal to the third node and inputs the second power source signal to the second node, and the switch circuit can ensure a disconnection between the second and third nodes. Thus, the first power source signal of the third node is prevented from being written into the second node, thereby the electric potential stability of the second node is ensured. Further, as the reset circuit resets the first node and the output end under the control of the second node, after the electric potential of the second node is stabilized, the electric potential stability of the first node and the output end can be ensured.

Figure 9:
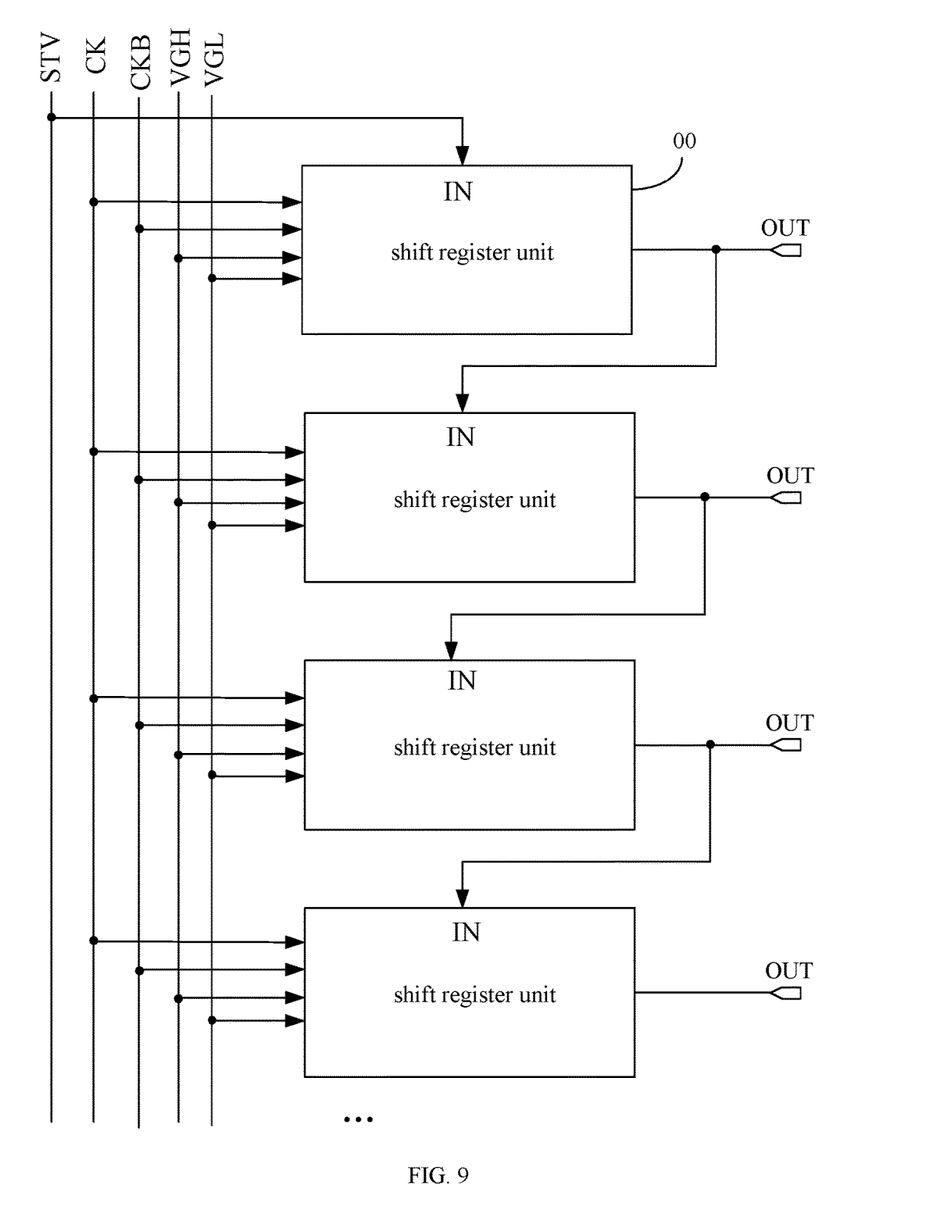
FIG. 9 is a structural schematic view of a gate electrode driving circuit provided by an embodiment of the present disclosure.

FIG. 9 shows a gate electrode driving circuit provided by an embodiment of the present disclosure. The gate electrode driving circuit may include at least two cascading shift register units 00, each of which may be the shift register unit shown in any of FIGS. 1-5. As it can be seen from FIG. 9, the input signal end IN of each shift register unit is connected to the output end OUT of the shift register unit of the previous stage, and the input signal end IN of the shift register unit of the first stage is connected to the frame starting signal end STV.

In addition, only two clock signal ends CK and CKB are used in the gate electrode driving circuit provided by the embodiments of the present disclosure. This provides sufficient wiring space, facilitates the wire width increase, reduces the load, improves the anti-static electricity capacity of the circuit and lowers the requirements on the integrated circuit. As it can be further seen from FIG. 7, the clock signals output by the two clock signal ends CK and CKB have the same frequency and the opposite phases, but the duty ratio of each clock signal is not a half. Thus, the hopping time of the two clock signals can be staggered by some time. And the following case can be avoided: logical errors may occur to the gate electrode driving circuit when the two clock signals are at their hopping edges simultaneously.

Figure 10:
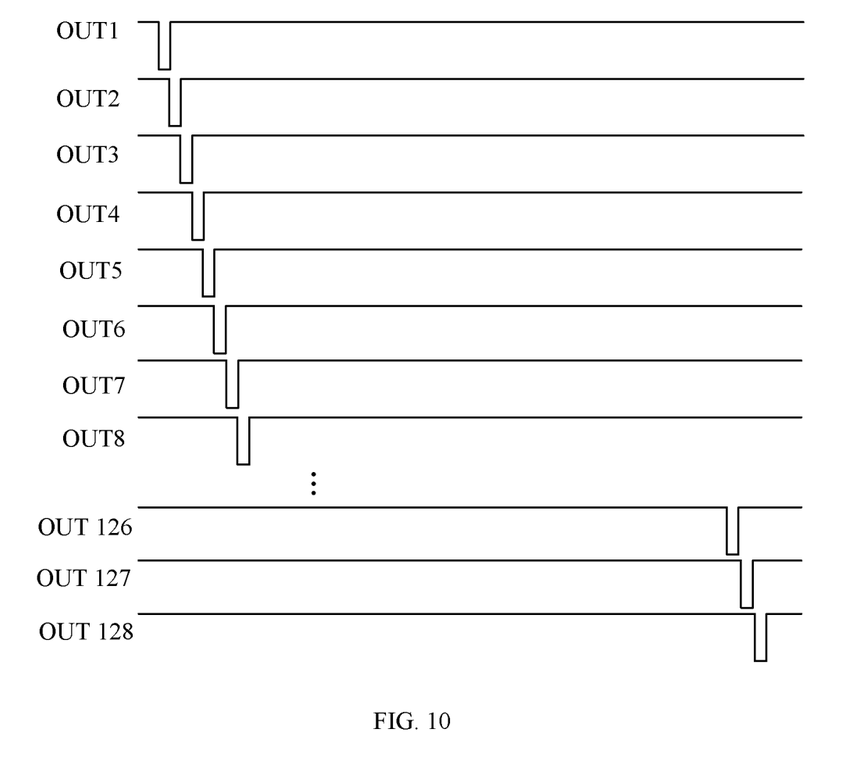
FIG. 10 is an output sequence diagram of a gate electrode driving circuit provided by an embodiment of the present disclosure.

FIG. 10 is an output sequence diagram of each shift register unit in a gate electrode driving circuit provided by an embodiment of the present disclosure. As it can be seen from FIG. 10, assuming that the gate electrode driving circuit includes 128 cascading shift register units, the shift register units in the gate electrode driving circuit can sequentially output signals OUT1 to OUT128 and the waveform of the output signals of each shift register unit is relatively stable.

An embodiment of the present disclosure provides a display apparatus which may include the gate electrode driving circuit shown in FIG. 9. The gate electrode driving circuit may include at least two cascading shift register units shown in any of FIGS. 1-5. The display apparatus may be a liquid crystal panel, an electronic paper, an OLED panel, an AMOLED panel, a cell phone, a tablet computer, a TV, a display, a notebook computer, a digital photo frame, a navigator or any other product or member having a display function.

An embodiment of the present disclosure also provides a non-transitory readable storage medium storing instructions that, when executed on a processing component, cause the processing component to perform the driving method provided by the embodiment shown in FIG. 6.

A person of ordinary skill in the art may clearly understand that, for the convenience and conciseness of description, the specific working process of the shift register unit and circuits described above may be referenced to the corresponding process in the method embodiment described above, and will not repeated herein.

The foregoing are alternative embodiments of the present disclosure, and are not intended to limit the present disclosure. Within the spirit and principles of the disclosure, any modifications, equivalent substitutions, improvements, etc., are within the scope of protection of the present disclosure.

What is claimed is:

1. A shift register unit, comprising:
an input circuit, an output circuit, a control circuit, a reset circuit, and a switch circuit; wherein
the input circuit is connected to an input signal end and a first node respectively, and is configured to control an electric potential of the first node under the control of an input signal from the input signal end;
the output circuit is connected to a first clock signal end, the first node, and an output end respectively, and is configured to input a first clock signal from the first clock signal end to the output end under the control of the first node;
the control circuit is connected to a second clock signal end, a first power source signal end, a second power source signal end, the first node, a second node and a third node respectively, and is configured to input a second power source signal from the second power source signal end to the second node under the control of the first node and input a first power source signal from the first power source signal end to the third node under the control of a second clock signal from the second clock signal end, wherein the first power source signal has a first electric potential and the second power source signal has a second electric potential;
the reset circuit is connected to the second node, the first node, the output end and the second power source signal end respectively, and is configured to input the second power source signal to the first node and the output end under the control of the second node;
the switch circuit is connected to the input signal end, the first clock signal end, the first power source signal end, the second power source signal end, the second node and the third node respectively, and is configured to control the second and third nodes to be disconnected through the second power source signal when an electric potential of the input signal is the first electric potential, and control the second and third nodes to be connected through the first power source signal when an electric potential of the first clock signal is the first electric potential.

2. The shift register unit of claim 1, wherein the switch circuit comprises a control sub-circuit and a switch sub-circuit;
the control sub-circuit is connected to the input signal end, the first clock signal end, the first power source signal end, the second power source signal end and a switch node respectively, and is configured to input the second power source signal to the switch node when the electric potential of the input signal is the first electric potential and input the first power source signal to the switch node when the electric potential of the first clock signal is the first electric potential;
the switch sub-circuit is connected to the switch node, the second node and the third node respectively, and is configured to control the second and third nodes to be disconnected when the electric potential of the switch node is the second electric potential and control the second and third nodes to be connected when the electric potential of the switch node is the first electric potential.

3. The shift register unit of claim 2, wherein the control sub-circuit comprises a first transistor, a second transistor and a first capacitor;
a gate electrode of the first transistor is connected to the input signal end, a first electrode thereof is connected to the second power source signal end and a second electrode thereof is connected to the switch node;
a gate electrode of the second transistor is connected to the first clock signal end, a first electrode thereof is connected to the first power source signal end and a second electrode thereof is connected to the switch node;
one end of the first capacitor is connected to the second power source signal end and the other end thereof is connected to the switch node.

4. The shift register unit of claim 2, wherein the switch sub-circuit comprises a third transistor;
a gate electrode of the third transistor is connected to the switch node, a first electrode thereof is connected to the third node and a second electrode thereof is connected to the second node.

5. The shift register unit of claim 1, wherein the input circuit comprises a fourth transistor;
a gate electrode and a first electrode of the fourth transistor are respectively connected to the input signal end, and a second electrode thereof is connected to the first node.

6. The shift register unit of claim 1, wherein the output circuit comprises a fifth transistor and a second capacitor;
a gate electrode of the fifth transistor is connected to the first node, a first electrode thereof is connected to the first clock signal end and a second electrode thereof is connected to the output end;
one end of the second capacitor is connected to the first node and the other end thereof is connected to the output end.

7. The shift register unit of claim 1, wherein the control circuit comprises a sixth transistor, a seventh transistor and a third capacitor;
a gate electrode of the sixth transistor is connected to the first node, a first electrode thereof is connected to the second power source signal end and a second electrode thereof is connected to the second node;
a gate electrode of the seventh transistor is connected to the second clock signal end, a first electrode thereof is connected to the first power source signal end and a second electrode thereof is connected to the third node;
one end of the third capacitor is connected to the second node and the other end thereof is connected to the second power source signal end.

8. The shift register unit of claim 1, wherein the reset circuit comprises an eighth transistor and a ninth transistor;
a gate electrode of the eighth transistor is connected to the second node, a first electrode thereof is connected to the second power source signal end and a second electrode thereof is connected to the first node;
a gate electrode of the ninth transistor is connected to the second node, a first electrode thereof is connected to the second power source signal end and a second electrode thereof is connected to the output end.

9. The shift register unit of claim 1, wherein the input circuit is connected to a reset signal end, a first control signal end and a second control signal end, and comprises a tenth transistor and an eleventh transistor;

a gate electrode of the tenth transistor is connected to the input signal end, a first electrode thereof is connected to the first control signal end and a second electrode thereof is connected to the first node;

a gate electrode of the eleventh transistor is connected to the reset signal end, a first electrode thereof is connected to the second control signal end and a second electrode thereof is connected to the first node.

10. The shift register unit of claim 6, wherein the output circuit further comprises a twelfth transistor;

a gate electrode of the twelfth transistor is connected to the first power source signal end, a first electrode thereof is connected to a pull-up node, and a second electrode thereof is connected to the gate electrode of the fifth transistor and the one end of the second capacitor respectively.

11. The shift register unit of claim 3, wherein all the transistors are P-type transistors, and the first electric potential is a low electric potential relative to the second electric potential.

12. A driving method of a shift register unit, the shift register unit comprising an input circuit, an output circuit, a control circuit, a reset circuit and a switch circuit, and the method comprising:

an input stage during which an input signal output by an input signal end has a first electric potential, a second clock signal output by a second clock signal end has the first electric potential, the input circuit charges a first node, the control circuit inputs a first power source signal from a first power source signal end to a third node and inputs a second power source signal from a second power source signal end to a second node, the switch circuit controls the second and third nodes to be disconnected under the control of the input signal and the second power source signal, wherein the first power source signal has a first electric potential and the second power source signal has a second electric potential;

an output stage during which a first clock signal output by a first clock signal end has the first electric potential, the first node maintains the first electric potential, the output circuit inputs the first clock signal to the output end under the control of the first node, and the switch circuit controls the second and third nodes to be connected under the control of the first clock signal and the first power source signal; and a reset stage during which the second clock signal has the first electric potential, the control circuit inputs the first power source signal to the third node, the switch circuit controls the second and third nodes to maintain their connected states so that the electric potential of the third node is written into the second node, and the reset circuit inputs the second power source signal to the first node and the output end respectively under the control of the second node.

13. The method of claim 12, wherein the switch circuit comprises a control sub-circuit and a switch sub-circuit; the control sub-circuit comprises a first transistor, a second transistor and a first capacitor; the switch sub-circuit comprises a third transistor; a first electrode of the third transistor is connected to the third node and a second electrode thereof is connected to the second node;

during the input stage, the input signal has the first electric potential, the first transistor in the control sub-circuit is turned on, the second power source signal end outputs the second power source signal to a switch node, and the third transistor is turned off;

during the output stage, the first clock signal has the first electric potential, the second transistor in the control sub-circuit is turned on, the first power source signal end outputs the first power source signal to the switch node, and the third transistor is turned on;

during the reset stage, the first capacitor in the control sub-circuit enables the switch node to maintain the first electric potential, and the third transistor maintains its on state.

14. The method of claim 12, wherein the input circuit comprises a fourth transistor; the output circuit comprises a fifth transistor and a second capacitor;

during the input stage, the input signal has the first electric potential, the fourth transistor is turned on, the input signal end charges the first node, the fifth transistor is turned on, and the first clock signal end outputs the first clock signal having the second electric potential to the output end;

during the output stage, the first clock signal has the first electric potential, the second capacitor enables the first node to maintain the first electric potential, the fifth transistor maintains its on state, and the first clock signal end outputs the first clock signal having the first electric potential to the output end.

15. The method of claim 12, wherein the control circuit comprises a sixth transistor, a seventh transistor and a third capacitor;

during the input stage, the electric potential of the first node is the first electric potential, the second clock signal has the first electric potential, the sixth transistor is turned on under the control of the first node, the seventh transistor is turned on under the control of the second clock signal, the second power source signal end outputs the second power source signal to the second node via the sixth transistor, and the first power source signal end outputs the first power source signal to the third node via the seventh transistor;

during the reset stage, the first node has the second electric potential, the sixth transistor is turned off, the second clock signal has the first electric potential, the seventh transistor is turned on, and the first power source signal end outputs the first power source signal to the third node.

16. The method of claim 12, wherein the reset circuit comprises an eighth transistor and a ninth transistor;

during the reset stage, the second node has the first electric potential, the eighth and ninth transistors are turned on, and the second power source signal end outputs the second power source signal to the first node via the eighth transistor and to the output end via the ninth transistor.

17. The method of claim 13, wherein all the transistors are P-type transistors, and the first electric potential is a low electric potential relative to the second electric potential.

18. A gate electrode driving circuit, comprising:

at least two cascading shift register units, each of which comprising:

an input circuit, an output circuit, a control circuit, a reset circuit, and a switch circuit; wherein the input circuit is connected to an input signal end and a first node respectively, and is configured to control the electric potential of the first node under the control of an input signal from the input signal end;

the output circuit is respectively connected to a first clock signal end, the first node, and an output end, and is configured to input a first clock signal from the first clock signal end to the output end under the control of the first node;

the control circuit is connected to a second clock signal end, a first power source signal end, a second power source signal end, the first node, a second node and a third node respectively, and is configured to input a second power source signal from the second power source signal end to the second node under the control of the first node and input a first power source signal from the first power source signal end to the third node under the control of a second clock signal from the second clock signal end, wherein the first power source signal has a first electric potential and the second power source signal has a second electric potential;

the reset circuit is connected to the second node, the first node, the output end and the second power source signal end respectively, and is configured to input the second power source signal to the first node and the output end under the control of the second node;

the switch circuit is connected to the input signal end, the first clock signal end, the first power source signal end, the second power source signal end, the second node and the third node respectively, and is configured to control the second and third nodes to be disconnected through the second power source signal when the input signal has the first electric potential, and control the second and third nodes to be connected through the first power source signal when the first clock signal has the first electric potential.

19. A display apparatus, comprising the gate electrode driving circuit of claim 18.

20. A non-transitory readable storage medium storing instructions that, when executed on a processing component, cause the processing component to perform the driving method of claim 12.

* * * * *